(12) United States Patent
Katsumata et al.

(10) Patent No.: US 8,013,403 B2
(45) Date of Patent: Sep. 6, 2011

(54) SENSOR APPARATUS FOR DETECTING VARIATIONS IN A DYNAMIC QUANTITY WHILE SUPPRESSING DETECTION DEVIATIONS THAT ARE CAUSED BY BENDING DEFORMATION OF A SENSOR CHIP

(75) Inventors: Takashi Katsumata, Kariya (JP); Masaki Takashima, Chiryu (JP); Mikio Sugiki, Toyokawa (JP)

(73) Assignee: DENSO CORPORATION, Kariya (JP)

( * ) Notice: Subject to any disclaimer, the term of this patent is extended or adjusted under 35 U.S.C. 154(b) by 651 days.

(21) Appl. No.: 12/149,001

(22) Filed: Apr. 24, 2008

(65) Prior Publication Data

US 2010/0025783 A1    Feb. 4, 2010

(30) Foreign Application Priority Data

Apr. 25, 2007   (JP) .................................. 2007-115595

(51) Int. Cl.
*H01L 29/84* (2006.01)
(52) U.S. Cl. .. 257/415; 257/414; 257/254; 257/E29.324
(58) Field of Classification Search .................. 257/414, 257/415, 254
See application file for complete search history.

(56) References Cited

U.S. PATENT DOCUMENTS

| | | | |
|---|---|---|---|
| 6,892,576 B2 * | 5/2005 | Samuels et al. ............ | 73/514.32 |
| 7,166,911 B2 | 1/2007 | Karpman et al. | |
| 2004/0041254 A1 | 3/2004 | Long et al. | |
| 2004/0182156 A1 * | 9/2004 | Goto .......................... | 73/514.32 |
| 2005/0035446 A1 | 2/2005 | Karpman et al. | |

FOREIGN PATENT DOCUMENTS

| | | |
|---|---|---|
| JP | A-2002-039759 | 2/2002 |
| JP | A-2006-098168 | 4/2006 |
| JP | A-2006-518673 | 8/2006 |
| JP | 2007263740 A * | 10/2007 |

* cited by examiner

*Primary Examiner* — Ken A Parker
*Assistant Examiner* — Jose R Diaz
(74) *Attorney, Agent, or Firm* — Posz Law Group, PLC (57) ABSTRACT

A miniaturized sensor such as a micro-accelerometer includes a sensor chip having a sensor element mounted thereon, with the sensor element being oriented with its central axes passing through the corners of the sensor chip. The corners of the sensor element are thereby located substantially apart from the corners of the sensor chip, so that bending deformation which displaces corners of the sensor chip is substantially prevented from causing displacement of corners of the sensor element. Detection inaccuracy resulting from such displacement can thereby be prevented or reduced.

5 Claims, 6 Drawing Sheets

SENSOR APPARATUS FOR DETECTING VARIATIONS IN A DYNAMIC QUANTITY WHILE SUPPRESSING DETECTION DEVIATIONS THAT ARE CAUSED BY BENDING DEFORMATION OF A SENSOR CHIP

CROSS-REFERENCE TO RELATED APPLICATIONS

This application is based on and incorporates herein by reference Japanese Patent Application No. 2007-115595 filed on Apr. 25, 2007.

BACKGROUND OF THE INVENTION

1. Field of Application

The present invention relates to a sensor apparatus in which a plurality of detection blocks produce respective signals in accordance with a dynamic quantity that acts from the exterior, with a differential output signal being obtained from the signals of the detection blocks, for thereby canceling deviations due to external disturbing effects and detecting only the required variations in the dynamic quantity.

2. Description of Related Art

For example in the case of an electrostatic capacitance type of microminiature angular velocity sensor or accelerometer (referred to in the following as a micro-angular velocity sensor and a micro-accelerometer respectively), which must detect minute variations in electrostatic capacitance, large changes can occur in the zero-point of an output detection signal from the sensor if variations occur in electrostatic capacitance as a result of causes other than changes in acceleration or in angular velocity.

Such a sensor generally is based on a sensor chip, with a sensor element being mounted on one face of the sensor chip, and changes in capacitance between comb electrodes of the sensor element being detected to obtain an output signal. There is a specific problem at present concerning bending deformation of the sensor chip of this type of sensor. This deformation may be caused by thermal distortion, etc., of a package that contains the sensor chip, or of a printed circuit board on which such a package is mounted. This is a problem in that such deformation of the sensor chip can produce corresponding deformation of the sensor element that is mounted on the sensor chip, and thereby alter the spacings between the comb electrodes of the sensor element, or areas of overlap between respective comb electrodes. Variations in these spacings or overlap areas are detected (as electrical signals resulting from changes in electrostatic capacitance), to detect changes in a dynamic quantity such as acceleration. Thus, the zero point of such detection will deviate and the detection accuracy will thereby be lowered, when such deformation of the sensor chip is transmitted to the sensor element.

In the case of a known type of sensor having a multi-layer chip configuration, as described for example in Japanese patent first publication No. 2006-98168 (referred to in the following as reference document 1), the effects of thermal distortion are reduced by disposing a material such as a soft adhesive film between the chips. However such measures are not sufficient to prevent the above-described variations in the zero point.

In the element structure of a micro-angular velocity sensor or a micro-accelerometer, the element is basically divided into a plurality of detection blocks (e.g., each having a pair of opposing intermeshed comb electrodes). A differential circuit obtains a differential output signal from respective detected capacitance amounts that are obtained by the detection blocks. Extraneous variations in electrostatic capacitance due to certain specific causes can thereby be cancelled, with only the required changes in electrostatic capacitance (i.e., caused by changes in a dynamic quantity such as acceleration or angular velocity) being detected.

In the case of a micro-angular velocity sensor, the difference between the outputs from respective differential circuits is obtained, to thereby cancel variations in the electrostatic capacitance that are caused by externally applied shock. In the case of a micro-accelerometer, the difference between the outputs from two detection blocks is obtained. The respective set values of electrostatic capacitance of these detection blocks may deviate, or the zero point may deviate substantially for each of the detection blocks, due to causes such as manufacturing variations in vibrator elements, etc. By using the difference between the respective outputs from these two detection blocks, the effects of deviations in the set values and in the zero point can be cancelled.

Figure 9A:
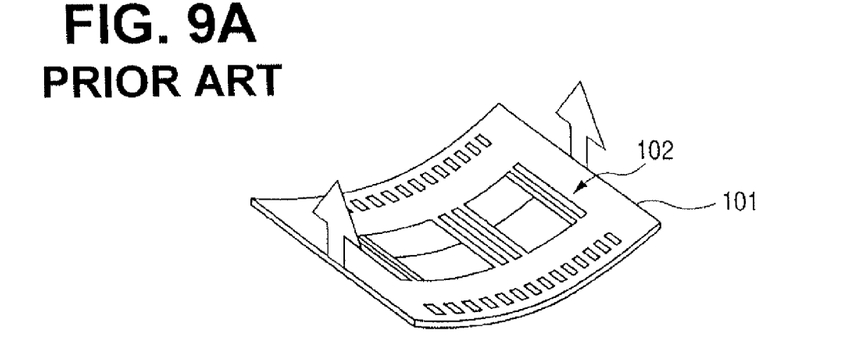
FIGS. 9A and 9B are oblique views respectively illustrating bending deformation of a sensor chip with respect to two central axes of the chip.
Figure 9B:
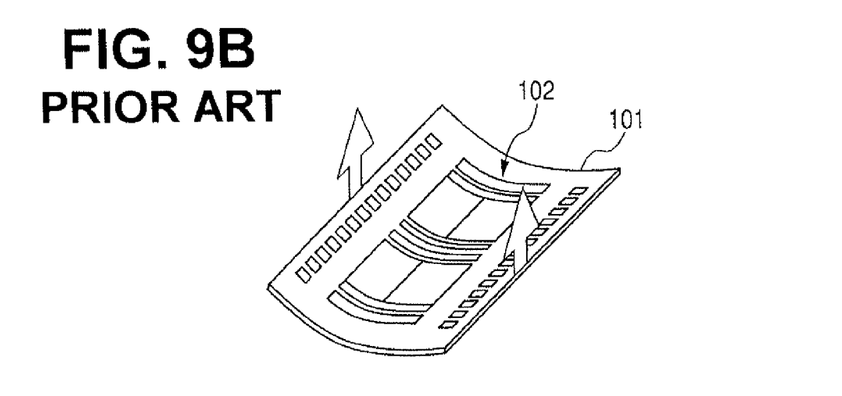

Such an arrangement also enables cancellation of the effects of specific types of chip deformation on electrostatic capacitance in a sensor element, i.e., types of deformation as illustrated in FIGS. 9A and 9B. In the following, an axis which connects the centers of opposing sides of a sensor chip or a sensor element will be referred to as a central axis of the chip or element. The type of deformation shown in FIGS. 9A, 9B can be caused by thermal distortion. In the example of FIG. 9A, in a miniaturized sensor apparatus such as an micro-accelerometer, a sensor chip 101 has a sensor element 102 mounted on its upper face, and the sensor chip 101 has bow-shape deformation with respect to one of its central axes. In the example of FIG. 9B there is similar bow-shape deformation about the other central axis of the sensor chip 101. Changes in values of electrostatic capacitance (obtained from the sensor element 102) which result from this type of deformation can be cancelled by obtaining a differential output, as described above, e.g., by using the difference between respective output signals from two detection blocks in the sensor element 102.

Figure 10:
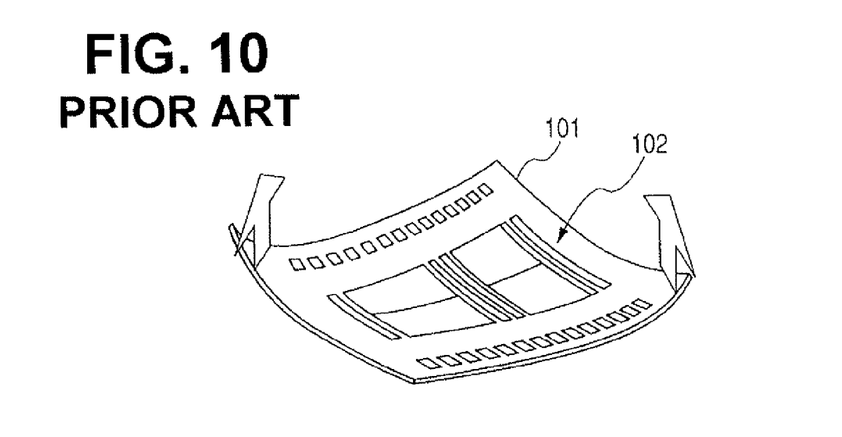
FIG. 10 is an oblique view illustrating bending deformation of a sensor chip which displaces diagonally opposing corners of the chip.

However it is also necessary to consider the form of deformation illustrated in FIG. 10, in which bending forces act at the corners of the sensor chip 101. This results in bending deformation of the chip by forces acting on diagonally opposing corners of the chip. Cancellation of the changes in electrostatic capacitance which result from this type of deformation cannot be achieved to a sufficient extent, by simply obtaining a differential output. Hence, deviation of the zero point will occur. This represents a serious problem with respect to accurate operation of a micro-angular velocity sensor or micro-accelerometer.

SUMMARY OF THE INVENTION

It is an objective of the present invention to overcome the above problem, by providing a miniaturized type of sensor apparatus which derives a difference output signal for the purpose of canceling the effects of disturbing forces which distort a sensor chip of the sensor apparatus, and thereby detecting only those variations in a dynamic quantity that are required to be detected. It thereby becomes possible to substantially prevent a lowering of the zero point accuracy caused by such deformation of the sensor chip, in particular, deformation which displaces respective corners of the sensor chip.

To achieve the above objective, from a first aspect, the invention provides a sensor apparatus having a sensor element that is mounted on a sensor chip, in which the sensor element is oriented with respective central axes of the sensor element passing through the corners of the sensor chip. It can thereby be ensured that when bending deformation of the sensor chip occurs (e.g., due to thermal distortion) which causes corners of the sensor chip to be become displaced, i.e., pulled upward or downward with respect to the main faces of the chip, similar deformation of the sensor element by displacement of the corners of the sensor element can be substantially prevented. This is enabled due to the fact that such a configuration enables the corners of the sensor element to be located as far as possible from the corners of the sensor chip.

Deviation of the zero point of the sensor apparatus, due to such deformation of the sensor element by displacement of corners of the sensor element, can thereby be substantially prevented.

The sensor element may be formed with a rectangular shape, and the sensor chip of rhomboid shape. In that case, the central axes of the sensor element are preferably oriented along respective lines of diagonal symmetry between opposing pairs of corners of the sensor chip.

From another aspect of the invention, each of the side faces of the sensor chip is formed to slope inward, to the lower face of the chip (i.e., the face of the chip that becomes joined to another component such as a circuit chip), for thereby reducing the area of contact between the sensor chip and the component which is to be joined to the lower face. In that way, the distance between the center of the lower face of the sensor chip and each corner of the area of contact can be shortened. This further serves to prevent deformation of the sensor element by displacement of corners of the sensor element, caused by deformation of the sensor chip which displaces the corners of the sensor chip. In addition, there is a reduced possibility of bonding sealant (applied at the time of bonding the sensor chip to another component) from sliding onto the upper face of the sensor chip.

Alternatively, the distance between the center of the lower face of the sensor chip and each corner of the area of contact can be shortened by removing a lower portion (i.e., forming a triangular-shaped facet which extends to the lower face of the sensor chip) from each of the corners of the sensor chip. This will also reduce the area of contact between the sensor chip and a component which is to be joined to the lower face of the sensor chip.

In either case, when the area of contact is reduced in such a manner, bonding pads of the sensor chip are preferably disposed in a region that corresponds to the area of contact.

DESCRIPTION OF PREFERRED EMBODIMENTS

An embodiment of a micro-angular velocity sensor (referred to in the following simply as angular velocity sensor) will be described referring to FIGS. 1 to 4. FIG. 2 is an oblique view of the sensor, with parts of a package and substrate of the sensor removed to illustrate the interior configuration. The angular velocity sensor 1 includes a sensor chip 2 which is a MEMS (Micro Electric Mechanical Systems) type of chip, a circuit chip 3 which is mounted on the underside of the sensor chip 2, and a ceramic package 4 which houses the sensor chip 2 and circuit chip 3. The sensor chip 2, the circuit chip 3 and the ceramic package 4 are respectively adhesively attached to one another.

Figure 1:
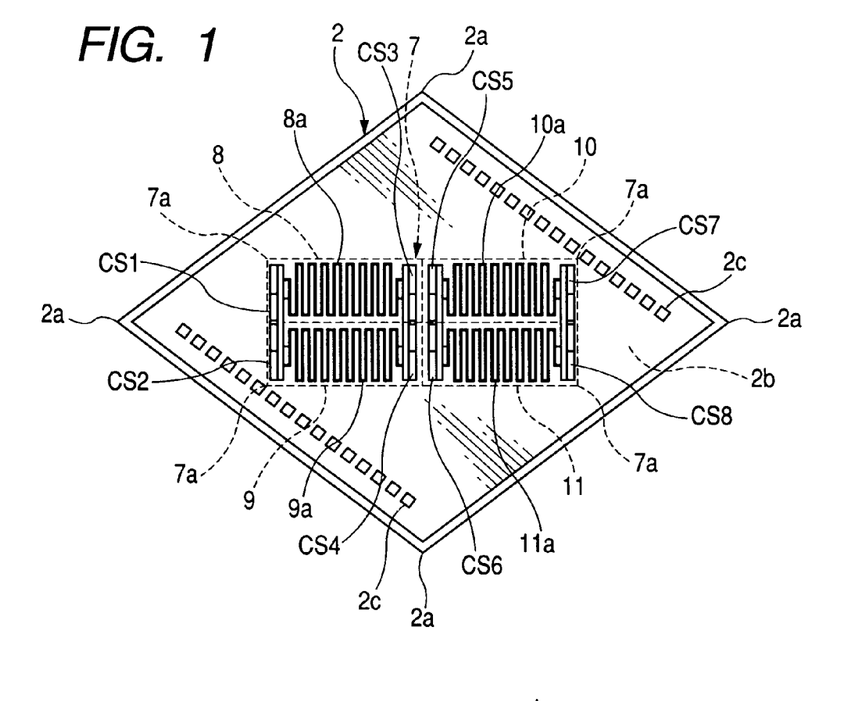
FIG. 1 conceptually illustrates a sensor chip of a first embodiment of the invention, which is a MEMS angular velocity sensor.
Figure 2:
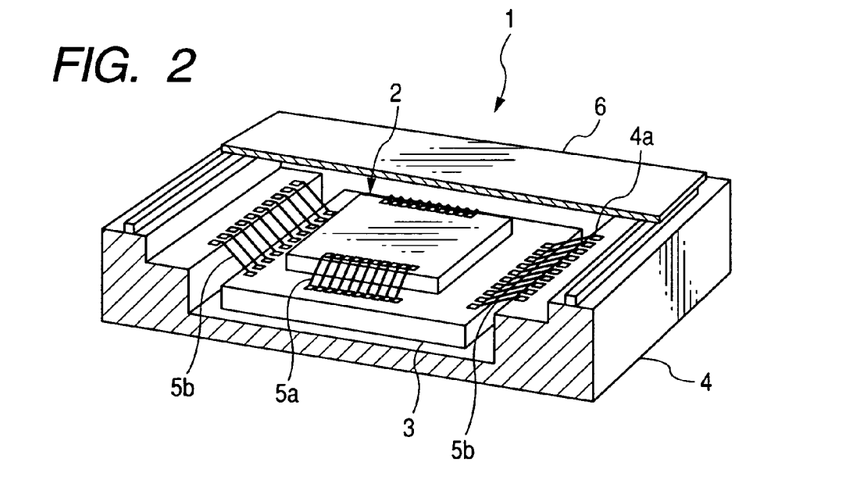
FIG. 2 is an oblique partially cut-away diagram illustrating the configuration of the first embodiment.

As shown in FIG. 1, the sensor chip 2 has fixed electrodes and movable electrodes, each being of comb-shaped configuration. With this embodiment, the dynamic quantity that is to be detected is angular velocity, and this is detected as changes in the electrostatic capacitance between the fixed electrodes and movable electrodes. The area of the sensor chip 2 is for example approximately 20 mm$^2$.

The circuit chip 3 serves to process signals that are transmitted from the sensor chip 2. The sensor chip 2 and the circuit chip 3 are electrically connected to one another by bonding wires 5a, and are contained within the interior of a ceramic package 4, sealed therein by a cover 6. An internal side of the ceramic package 4 is provided with a set of connecting lead terminals 4a, for outputting signals from the circuit chip 3 to the exterior. The connecting lead terminals 4a and the circuit chip 3 are electrically connected by bonding wires 5b.

FIG. 1 is a plan view which conceptually illustrates the sensor chip 2. As shown in FIG. 1, a sensor element 7 is disposed on the sensor chip 2, for detecting changes in electrostatic capacitance as described hereinafter. The sensor element 7 is formed on a semiconductor substrate, by micromachining technology.

The sensor element 7 is made up of first and second detection blocks 8 and 9, respectively shown at the left side of FIG. 1, and third and fourth detection blocks 10 and 11, respectively shown at the right side of FIG. 1. The first and second detection blocks 8 and 9 are disposed symmetrically opposing one another with respect to one of the central axes of the sensor element 7 (i.e., the horizontal central axis of the sensor element 7, as seen in FIG. 1). Similarly, the third and fourth detection blocks 10 and 11 are disposed symmetrically opposing one another with respect to that horizontal central axis of the sensor element 7. In addition, the pair of detection blocks 8 and 9 are disposed symmetrically opposing the pair of detection blocks 10 and 11 with respect to the other central axis of the sensor element 7 (i.e., the vertically-directed central axis of the sensor element 7, as seen in FIG. 1).

A pair of electrostatic capacitance detection sections CS1, CS3 which become of mutually opposite polarity when in a drive condition are respectively disposed at the left and right sides of the sensor block 8 (as viewed in FIG. 1), and similarly, a pair of electrostatic capacitance detection sections CS2, CS4 which become of mutually opposite polarity when in a drive condition are respectively disposed at the left and right sides of the sensor block 9 (as viewed in FIG. 1), a pair of electrostatic capacitance detection sections CS5, CS7 which become of mutually opposite polarity when in a drive condition are respectively disposed at the left and right sides of the sensor block 10 (as viewed in FIG. 1), and a pair of electrostatic capacitance detection sections CS6, CS8 which become of mutually opposite polarity when in a drive condition are respectively disposed at the left and right sides of the sensor block 11 (as viewed in FIG. 1).

Electrostatic drive sections 8a, 9a, 10a and 11a are respectively disposed at the centers of the detection blocks 8, 9, 10 and 11, for driving the electrostatic capacitance detection sections CS1 to CS8. The Electrostatic drive sections 8a, 9a, 10a and 11a drive the first and second detection blocks 8 and 9 and the third and fourth detection blocks 10 and 11 in the lateral direction as viewed in FIG. 1, with the pair of detection blocks 8 and 9 being driven with opposite polarity to the detection blocks 10 and 11.

The sensor chip 2 is of rhomboid shape, having its axes of symmetry respectively oriented along the central axes of the sensor element 7, as illustrated in FIG. 1. That is to say, each line that connects opposing corners of the sensor chip 2 coincides with a central axis of the sensor element 7. With such a configuration, the corners 7a of the sensor element 7 become spaced apart from the corners 2a of the sensor chip 2.

Figure 3:
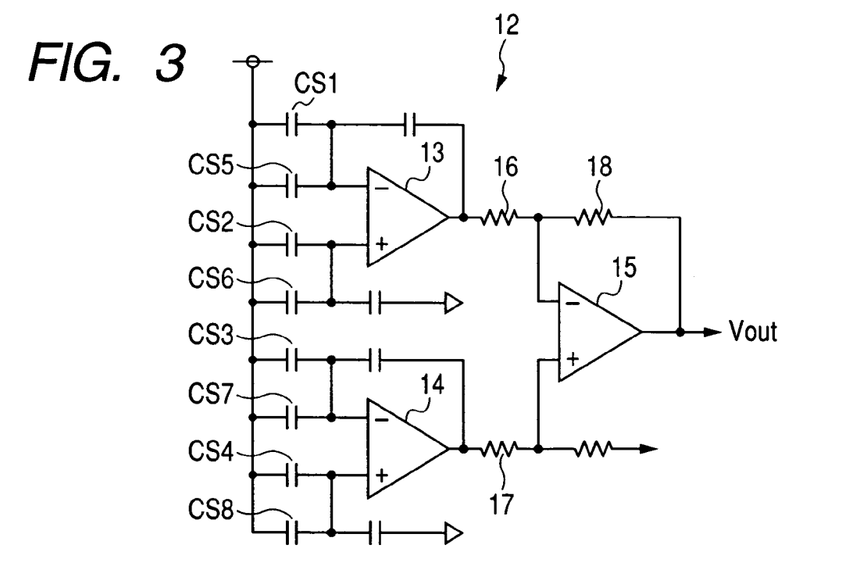
FIG. 3 is a circuit diameter of a differential amplifier circuit of the first embodiment.

A differential amplifier circuit is formed in the circuit chip 3, having the circuit configuration shown in FIG. 3. Considering the electrostatic capacitance detection sections of the first through fourth detection blocks 8 to 11 of the sensor element 7, the electrostatic capacitance detection section CS1 and CS5 are connected in parallel to the inverting input terminal of a first operational amplifier 13, the electrostatic capacitance detection section CS2 and CS6 are connected in parallel to the non-inverting input terminal of the first operational amplifier 13, the electrostatic capacitance detection section CS3 and CS7 are connected in parallel to the inverting input terminal of a second operational amplifier 14, and the electrostatic capacitance detection section CS4 and CS8 are connected in parallel to the non-inverting input terminal of the second operational amplifier 14.

The output terminal of the first operational amplifier 13 is connected via a resistor 16 to the inverting input terminal of a third operational amplifier 15, while the output terminal of the second operational amplifier 14 is connected via a resistor 17 to the non-inverting input terminal of the third operational amplifier 15.

An amplified signal is produced from the output terminal of the third operational amplifier 15, with that output terminal being connected via a resistor 18 to the inverting input terminal of that operational amplifier.

The reason for using the circuit 12 having the form shown in FIG. 3 is to ensure that electrostatic capacitance variations which result from external disturbing effects such as shocks will not result in corresponding variations in the output signal, and also to prevent deviations of electrostatic capacitance from design values and prevent large deviations of the zero point.

With this circuit configuration, the electrostatic capacitance detection section CS1 to CS8 are driven in the horizontal direction (as viewed in FIG. 1) by the electrostatic drive sections 8a to 11a, and when the sensor chip undergoes angular acceleration about a line that is vertical to the plane of the paper (of FIG. 1) as a central axis, forces acting in upward and downward directions (as viewed in FIG. 1) will act on the electrostatic capacitance detection sections CS1 to CS8. As a result, the angular velocity of the sensor can be obtained based on the differential output signal from the differential amplifier circuit 12, having the circuit configuration shown in FIG. 3.

Figure 4A:
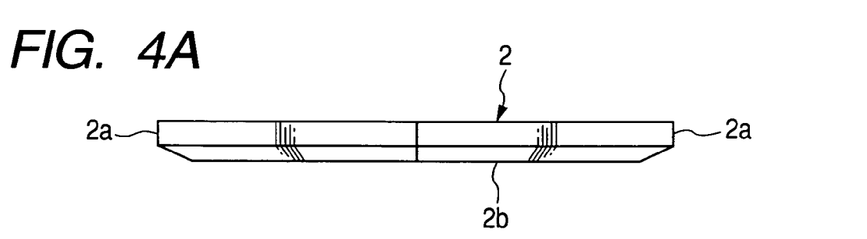
FIGS. 4A and 4B respectively show a side view and a plan view of the lower face of the sensor chip of the first embodiment.
Figure 4B:
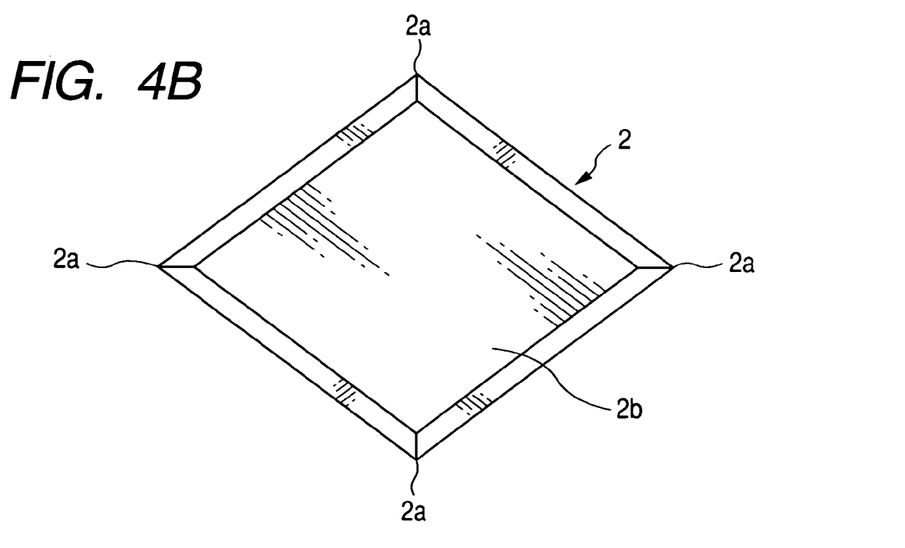

The lower face 2b of the sensor chip 2, which is joined to the circuit chip 3, is formed with sloping side faces as illustrated in FIGS. 4A and 4B. In that way, at each of the corners 2a of the sensor chip 2, a lower part of the corner has been removed, i.e., the apex of the corner is removed from contact with the circuit chip 3.

When thermal distortion of the package or of the printed circuit board (on which the package is mounted) is transmitted to the sensor chip 2, this can result in bending deformation of the sensor chip 2. In such a case, bending (bowing) of the sensor element 7 about a central axis can occur as illustrated in FIGS. 9A, 9B described above, with a resultant variations in the zero point. This type of deviation can be cancelled by the operation of the differential amplifier circuit 12. However deformation of the sensor element 7 can occur whereby a pair of opposing corners 7a are pulled upward (or downward) as illustrated in FIG. 10 above. A deviation of the zero point that results from such a type of deformation of the sensor element 7 cannot be cancelled by the operation of the differential amplifier circuit 12.

For that reason, with the present invention, a configuration is adopted whereby each of the corners 7a of the sensor element 7 is located substantially distant from the corners 2a of the sensor chip 2. Hence, even if warping forces cause the corners 2a of the sensor chip 2 to be displaced, resultant deformation of the sensor element 7 by displacement of a diagonally opposing pair of the corners 7a of the sensor element 7 (i.e., displacement whereby a diagonally opposing pair of the corners 7a are pulled upward or are pulled downward with respect to the plane of the paper, as viewed in FIG. 1) can be prevented or substantially suppressed.

Thus with this embodiment, since the sensor element 7 is oriented with each central axis of the sensor element 7 disposed coincident with a line which connects a pair of diagonally opposing corners of the sensor chip 2, each of the corners 7a of the sensor element 7 becomes spaced substantially apart from the corners 2a of the sensor chip 2. The embodiment therefore has the advantage over the prior art that the corners 7a of the sensor element 7 will not be readily displaced as a result of displacement of the corners of the sensor chip 2 causes by bending forces acting on the sensor chip 2. Deviations of the zero point due to such deformation of the sensor chip 2 can thereby be substantially prevented.

However this advantage is obtained simply by altering the orientation of the sensor element 7 with respect to the sensor chip 2, and so can be achieved with no increase in manufacturing cost.

Moreover, due to the fact that portions of the corners 2a of the sensor chip 2 adjacent to the lower face 2b of the sensor chip 2 (i.e., the face of the sensor chip 2 which becomes attached to an upper face of the circuit chip 3) are removed (as shown in FIGS. 4A, 4B), the effects of bending forces which are applied from the circuit chip 3 acting towards the corners 2a of the sensor chip 2 can be reduced. That is to say, an amount of displacement of diagonally opposing corners 2a of the sensor chip 2, as a result of such forces acting from the circuit chip 3, can be substantially reduced due to the fact that the distance from the center of the sensor chip 2 to the locations of each of the corners 2a (i.e., the locations where these corners attain the lower face 2b of the sensor chip 2) is shortened.

Second Embodiment

Figure 5:
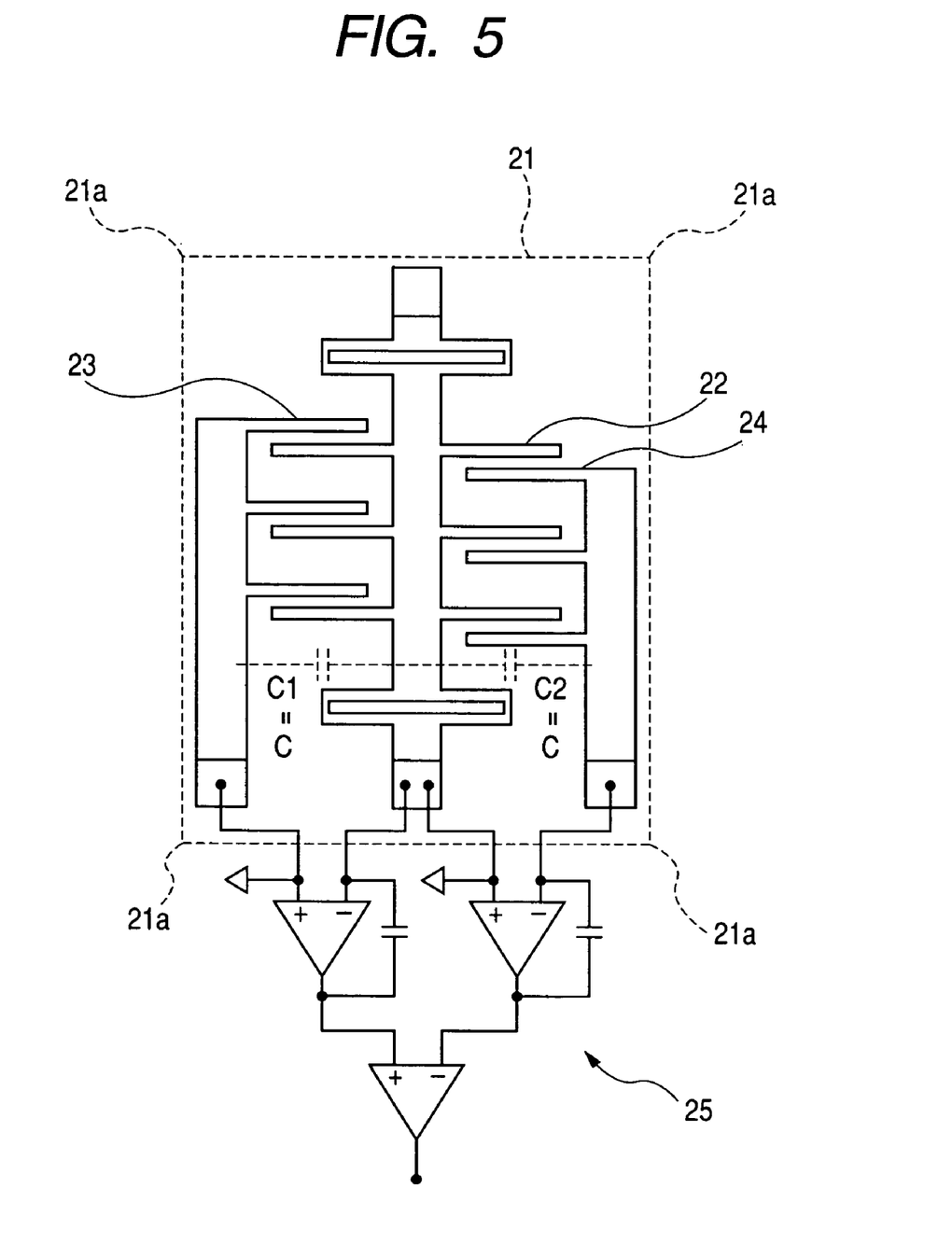
FIG. 5 conceptually illustrates a sensor element of a second embodiment, which is a MEMS accelerometer.
Figure 6:
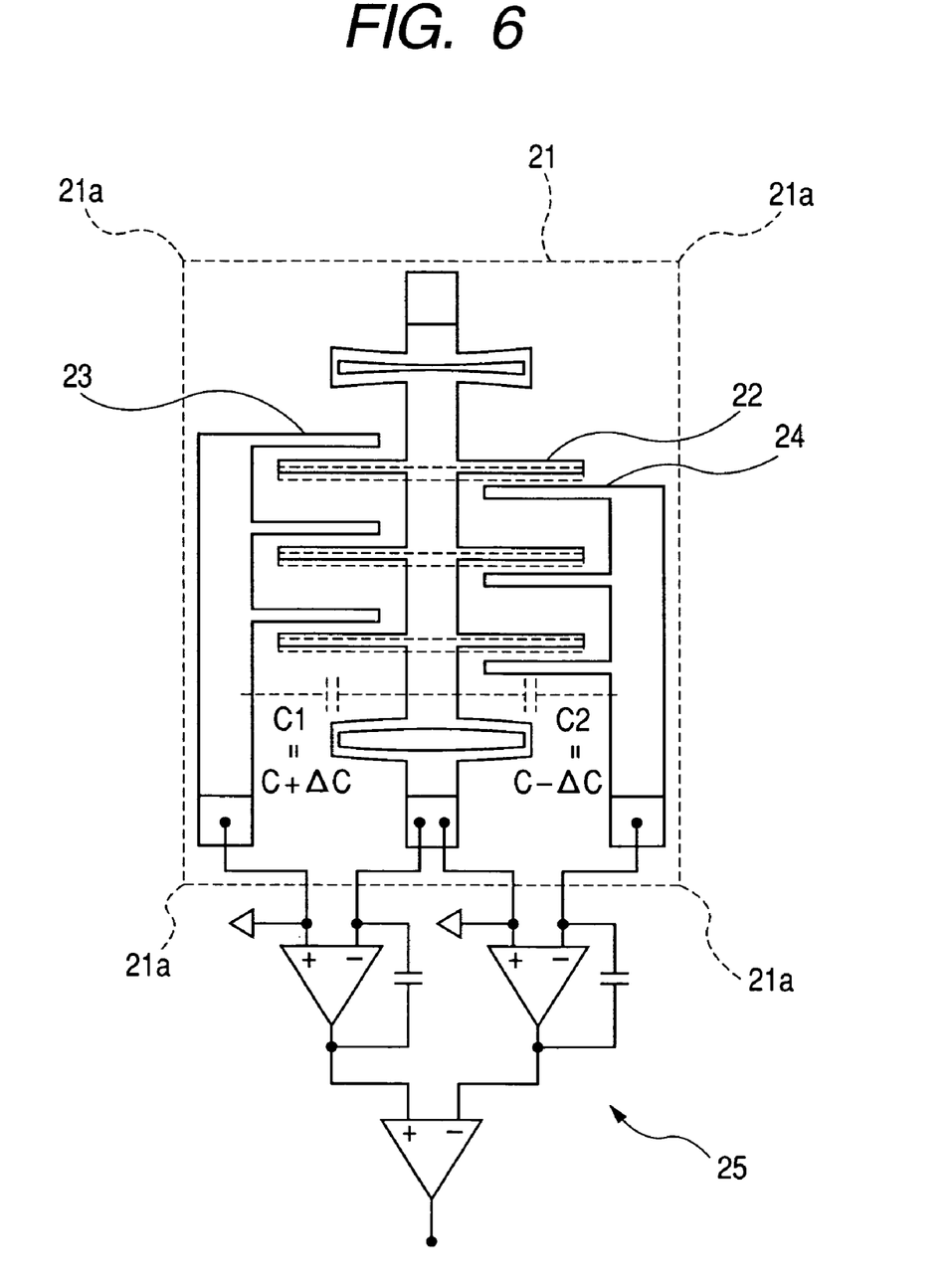
FIG. 6 is a diagram corresponding to FIG. 5, for illustrating the effect of acceleration on the sensor element.

A second embodiment of the invention, which is a miniaturized acceleration sensor that is also of MEMS type, will be described referring to FIGS. 5 and 6. FIG. 5 conceptually illustrates the sensor element of this embodiment. In FIG. 5, a sensor element 21 is made up of a comb-shaped movable electrode 22 having laterally extending tooth portions. The sensor element 21 is supported such as to be moveable in the vertical direction (as viewed in FIG. 5). A first fixed electrode 23 is disposed with tooth portions thereof respectively opposing the tooth portions extending on one side of the movable electrode 22 as shown, while a second fixed electrode 24 is disposed with tooth portions thereof respectively opposing the tooth portions that extend on the other side of the movable electrode 22.

Electrostatic capacitances C1 and C2 are respectively formed between the movable electrode 22 and the first fixed electrode 23 and between the movable electrode 22 and the second fixed electrode 24. A differential output signal is obtained by a differential circuit 25 from the voltages across the electrostatic capacitances C1 and C2. An indication of acceleration of the sensor element 21 can thereby be obtained based on the differential output signal from the differential circuit 25, based on changes $+\Delta C$ and $-\Delta C$ which occur in the electrostatic capacitances C1 and C2. These changes are caused by displacement of the movable electrode tooth portions due to the acceleration, as illustrated in FIG. 6.

With this embodiment, the sensor element 21 is disposed on a sensor chip 2 in the same orientation as described for the sensor block 8 of the first embodiment, i.e., with central axes of the sensor element 21 oriented along lines connecting symmetrically opposing corners of the sensor chip 2. In that way, the corners 21a of the sensor element 21 can be spaced substantially apart from the corners of the sensor chip 2, thereby providing the advantages described above for the first embodiment, by reducing the extent to which bending deformation of the sensor chip 2 can apply bending forces at the corners of the sensor element 21. Hence, deviation of the zero point of this embodiment of a micro-accelerometer can be substantially prevented, as for the micro-angular velocity sensor of the first embodiment.

Alternative Embodiments

Figure 7:
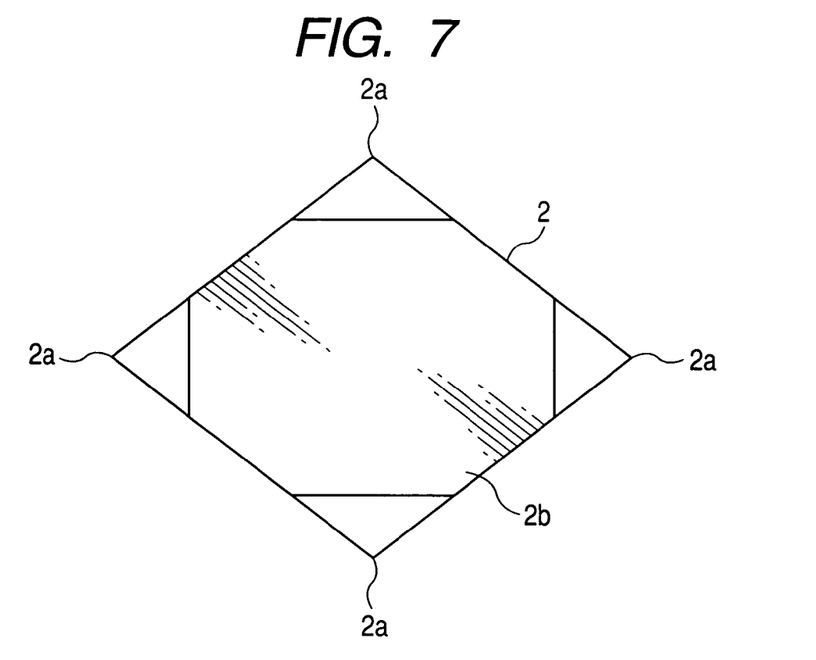
FIG. 7 is a plan view of the lower face of a sensor chip of another embodiment.

With the first embodiment as illustrated in FIGS. 4A and 4B, removal of a lower part of each corner portion of the sensor chip 2 is achieved by removing edge portions (each extending between a pair of corners) of the lower face 2b of the sensor chip 2). However it would be equally possible to achieve the same result by removing a triangular portion extending from the lower face 2b of the sensor chip 2, at each of the corners 2a of the sensor chip 2. This is illustrated in FIG. 7, in which the lower face 2b of the sensor chip 2 is viewed in plan. Each of the triangular regions 2d shown at the corners 2a of the sensor chip 2 in FIG. 7 should be understood as representing a facet which slopes downward from the plane of the paper (as viewed in FIG. 7), towards a corresponding corner 2a on the upper face of the sensor chip 2.

Figure 8:
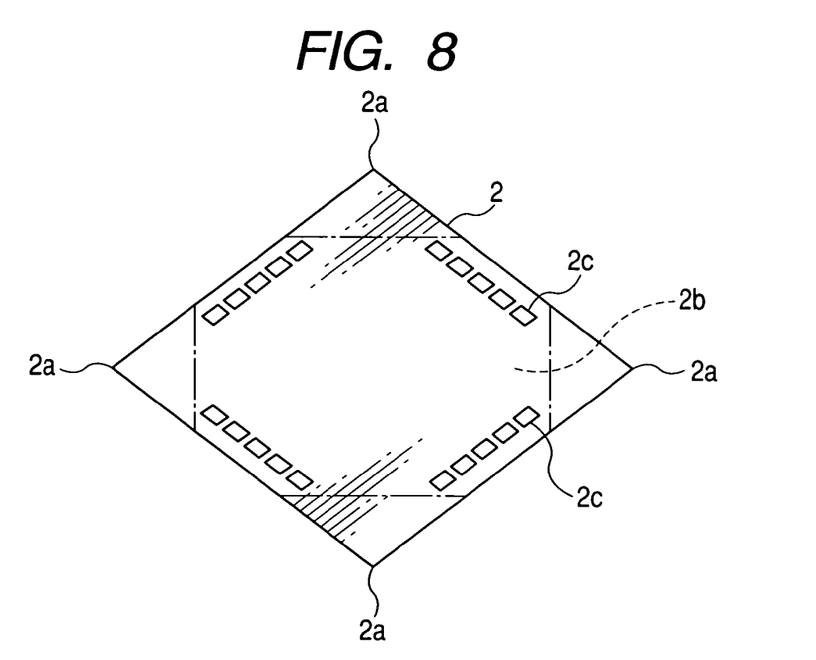
FIG. 8 is a plan view illustrating a preferred disposition of bonding pads on a sensor chip which is configured as shown in FIG. 7.

With such a configuration, it is preferable (as illustrated in FIG. 8) that the bonding pads 2c of the sensor chip 2 (for electrically connecting the sensor chip 2 to the circuit chip 3) be located at positions corresponding to (i.e., directly above) the region of the lower face 2b which becomes joined to the circuit chip 3. This is preferable, for reducing the danger that bonding seal may flow onto the sensor chip 2 when wire bonding is being performed.

Alternative Configurations

It would be equally possible to form both the sensor chip 2 and the circuit chip 3 with a rectangular shape, or other shape.

Furthermore the present invention is not limited in application to a micro-accelerometer or to a micro-angular velocity sensor having comb-shaped electrodes, but is applicable to any type of miniaturized sensor for which deviations in a detected dynamic quantity caused by extraneous disturbing forces acting on a sensor element are to be cancelled.

What is claimed is:

1. A sensor apparatus comprising
a sensor chip,
a sensor element mounted on said sensor chip, comprising a plurality of detection blocks for producing respective detection signals in accordance with an externally applied dynamic quantity, and
a differential output circuit coupled to receive said detection signals produced by said detection blocks, for thereby deriving a differential output signal indicative of said dynamic quantity while canceling extraneous components of said detection signals, where said extraneous components result from disturbance forces acting on said sensor element,
wherein said sensor element is disposed with each of respective central axes thereof coinciding with at least one corner of said sensor chip, and
wherein said sensor element is of rectangular shape, said sensor chip is of rhomboid shape, and said central axes of said sensor element coincide with respective pairs of diagonally opposite corners of said sensor chip.

2. A sensor apparatus comprising a sensor chip,
a sensor element mounted on said sensor chip, comprising a plurality of detection blocks for producing respective detection signals in accordance with an externally applied dynamic quantity, and
a differential output circuit coupled to receive said detection signals produced by said detection blocks, for thereby deriving a differential output signal indicative of said dynamic quantity while canceling extraneous components of said detection signals, where said extraneous components result from disturbance forces acting on said sensor element,
wherein said sensor element is disposed with each of respective central axes thereof coinciding with at least one corner of said sensor chip, and
wherein said sensor element is disposed on an upper face of said sensor chip and each of respective side faces of said sensor chip has at least a portion thereof formed to slope inward to a lower face of said sensor chip, for thereby reducing an area of contact between said lower face and a component which is to be joined to said sensor chip at said lower face.

3. A sensor apparatus according to claim 2, wherein said sensor element is disposed on an upper face of said sensor chip and each of respective side faces of said sensor chip has at least a portion thereof formed to slope inward to a lower face of said sensor chip, for thereby reducing an area of contact between said lower face and a component which is to be joined to said sensor chip at said lower face.

4. A sensor apparatus comprising a sensor chip,
a sensor element mounted on said sensor chip, comprising a plurality of detection blocks for producing respective detection signals in accordance with an externally applied dynamic quantity, and a differential output circuit coupled to receive said detection signals produced by said detection blocks, for thereby deriving a differential output signal indicative of said dynamic quantity while canceling extraneous components of said detection signals, where said extraneous components result from disturbance forces acting on said sensor element, wherein said sensor element is disposed with each of respective central axes thereof coinciding with at least one corner of said sensor chip, and wherein said sensor element is disposed on an upper face of said sensor chip and wherein each of respective corners of said sensor chip is formed with a lower portion thereof removed, for thereby reducing an area of contact between a lower face of said sensor chip and a component which is joined to said sensor chip at said lower face.

5. A sensor apparatus according to claim 4, wherein said sensor chip comprises a plurality of bonding pads, and wherein each of said bonding pads is located in a region corresponding to said area of contact.

* * * * *